(12) United States Patent
Hwang et al.

(10) Patent No.: US 9,287,441 B2
(45) Date of Patent: Mar. 15, 2016

(54) METHOD FOR MANUFACTURING SEMICONDUCTOR DEVICE

(71) Applicant: Kabushiki Kaisha Toshiba, Tokyo (JP)

(72) Inventors: Jongil Hwang, Kanagawa-ken (JP); Rei Hashimoto, Tokyo (JP); Shinji Saito, Kanagawa-ken (JP); Hung Hung, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/780,578

(22) Filed: Feb. 28, 2013

(65) Prior Publication Data

US 2014/0080240 A1    Mar. 20, 2014

(30) Foreign Application Priority Data

Sep. 20, 2012  (JP) ................................. 2012-207623

(51) Int. Cl.
  *H01L 21/00*  (2006.01)
  *H01L 33/00*  (2010.01)

(52) U.S. Cl.
  CPC .......... *H01L 33/0075* (2013.01); *H01L 33/007* (2013.01)

(58) Field of Classification Search
  CPC .............. H01L 33/0075; H01L 33/007; H01L 21/0237; H01L 21/02458; H01L 21/02639; H01L 21/02647; H01L 21/0254; H01L 21/20; H01L 33/00
  See application file for complete search history.

(56) References Cited

U.S. PATENT DOCUMENTS

| 2005/0003572 A1* | 1/2005 | Hahn et al. ...................... 438/47 |
| 2007/0037308 A1* | 2/2007 | Okuyama et al. ............... 438/46 |
| 2007/0194327 A1* | 8/2007 | Ueda et al. ...................... 257/79 |

FOREIGN PATENT DOCUMENTS

| JP | 61-294877   A | 12/1986 |
| JP | 2000-331946 A | 11/2000 |
| JP | 2002-368262 A | 12/2002 |
| JP | 2003-023220 A | 1/2003  |
| JP | 2003-086840 A | 3/2003  |

(Continued)

OTHER PUBLICATIONS

U.S. Appl. No. 13/405,903, filed Feb. 27, 2012, Hung Hung, et al.

(Continued)

*Primary Examiner* — Charles Garber
*Assistant Examiner* — Abdulfattah Mustapha
(74) *Attorney, Agent, or Firm* — Oblon, McClelland, Maier & Neustadt, L.L.P.

(57) ABSTRACT

According to one embodiment, a method for manufacturing a semiconductor device is disclosed. The method can prepare a substrate unit including a base substrate, an intermediate crystal layer, and a first mask layer. The intermediate crystal layer has a major surface having a first region, a second region, and a first intermediate region. The first mask layer is provided on the first intermediate region. The method can implement a first growth to grow a first lower layer on the first region and grow a second lower layer on the second region. The first and second lower layers include a semiconductor crystal. The method can implement a second growth to grow a second upper layer while growing a first upper layer to cover the first mask layer with the first and second upper layers. The method can implement cooling to separate the first and second upper layers.

20 Claims, 10 Drawing Sheets

(56) References Cited

FOREIGN PATENT DOCUMENTS

| | | |
|---|---|---|
| JP | 2004-119807 | 4/2004 |
| JP | 2004-336040 | 11/2004 |
| JP | 2007-258406 A | 10/2007 |

OTHER PUBLICATIONS

Haruo Nagai, et al., "Group III-V semiconductor mixed crystal," Kabushiki Kaisha Corona, Oct. 25, 1988, pp. 27-42 and Cover Page.

* cited by examiner

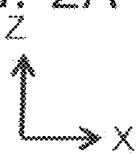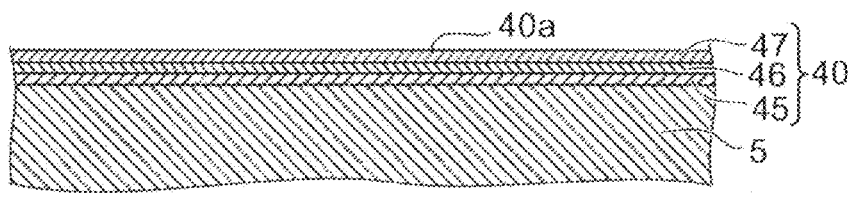
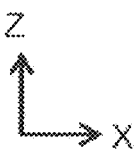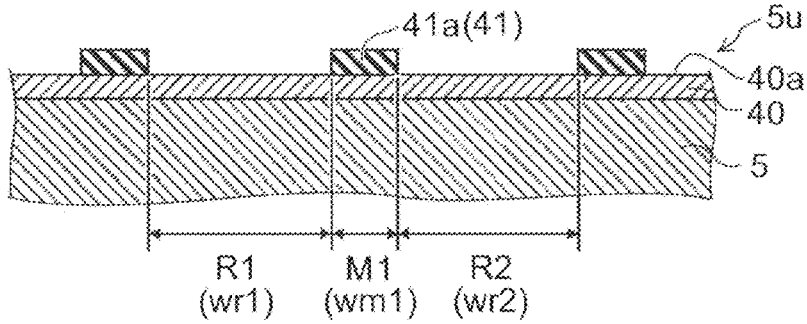
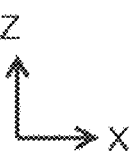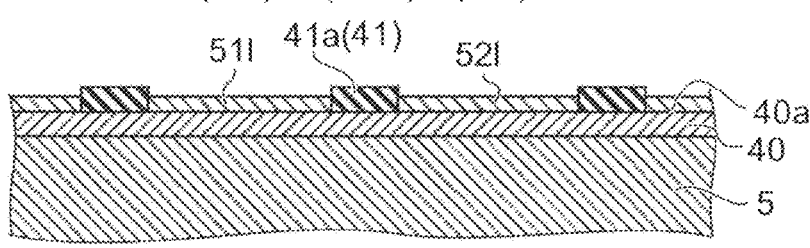
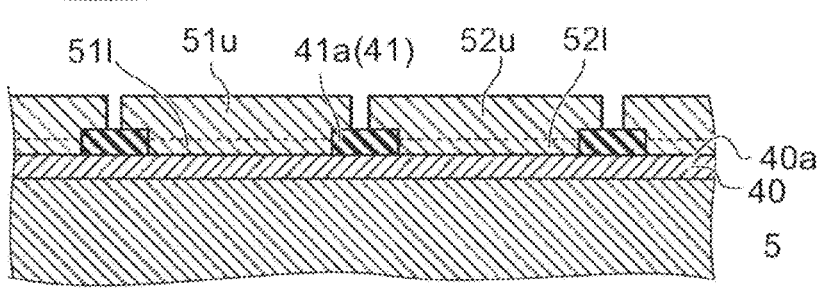
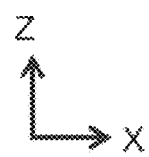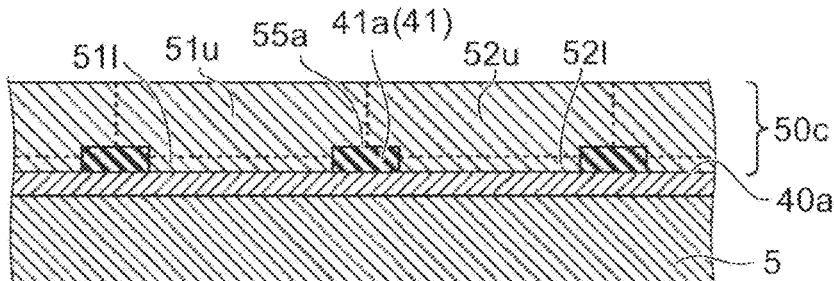
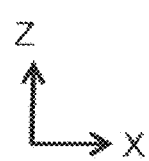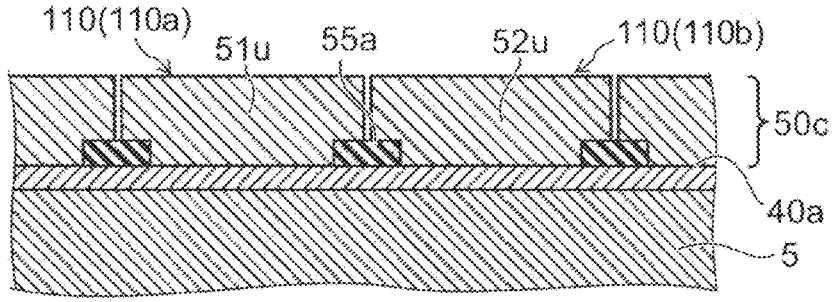

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2012-207623, filed on Sep. 20, 2012; the entire contents of which are incorporated herein by reference.

FIELD

Embodiments described herein relate generally to a method for manufacturing a semiconductor device.

BACKGROUND

There are semiconductor devices such as LDs (Laser Diodes), LEDs (Light Emitting Diodes), HEMTs (High electron mobility transistors), etc., that use nitride semiconductors. It is desirable to reduce the cost of such semiconductor devices by reducing the manufacturing processes from crystal growth to mounting.

BRIEF DESCRIPTION OF THE DRAWINGS

FIG. 2A to FIG. 2F are schematic cross-sectional views in order of the processes, showing the method for manufacturing the semiconductor device according to the first embodiment;

DETAILED DESCRIPTION

Figure 1:
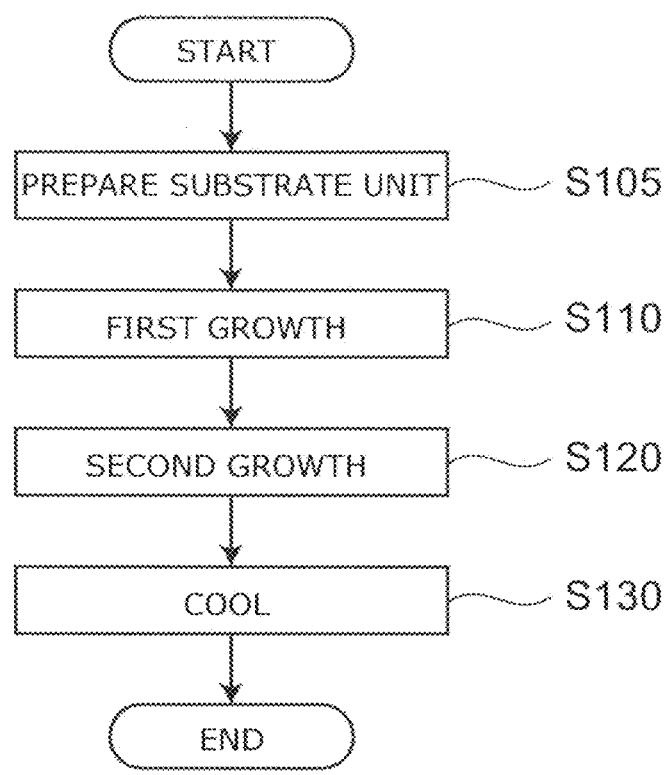
FIG. 1 is a flowchart showing a method for manufacturing a semiconductor device according to a first embodiment.

According to one embodiment, a method for manufacturing a semiconductor device is disclosed. The method can prepare a substrate unit including a base substrate, an intermediate crystal layer provided on the base substrate, and a first mask layer. The base substrate has a first coefficient of thermal expansion. The intermediate crystal layer has a first lattice constant. The intermediate crystal layer has a major surface having a first region, a second region, and a first intermediate region provided between the first region and the second region. The second region is separated from the first region in a first direction perpendicular to a stacking direction from the base substrate toward the intermediate crystal layer. The first mask layer is provided on the first intermediate region. The method can implement a first growth to grow a first lower layer on the first region at a first temperature and grow a second lower layer on the second region at the first temperature. The first lower layer includes a semiconductor crystal having a second coefficient of thermal expansion larger than the first coefficient of thermal expansion and a second lattice constant larger than the first lattice constant. The second lower layer includes the semiconductor crystal. The method can implement, at a second temperature, a second growth to grow a second upper layer including the semiconductor crystal on the second lower layer to extend onto the first mask layer while growing a first upper layer including the semiconductor crystal on the first lower layer to extend onto the first mask layer to cover the first mask layer with the first upper layer and the second upper layer by causing the first upper layer and the second upper layer to contact each other on the first mask layer. The method can implement cooling to separate the first upper layer and the second upper layer from each other at a first boundary where the first upper layer and the second upper layer contact each other on the first mask layer by reducing a temperature of the substrate unit, the first lower layer, the second lower layer, the first upper layer, and the second upper layer to a third temperature lower than the first temperature and the second temperature.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

The first embodiment relates to a method for manufacturing a semiconductor device.

The semiconductor device includes, for example, a semiconductor light emitting element, a semiconductor light receiving element, an electronic device, etc. The semiconductor light emitting element includes, for example, a light emitting diode (LED), a laser diode (LD), etc. The semiconductor light receiving element includes a photodiode (PD), etc. The electronic device includes, for example, a high electron mobility transistor (HEMT), a heterojunction bipolar transistor (HBT), a field effect transistor (FET), a Schottky barrier diode (SBD), etc.

The embodiment is applicable also to a semiconductor wafer for forming the semiconductor device recited above. For example, at least a portion of the semiconductor device or a portion used to form at least a portion of the semiconductor device is provided in the semiconductor wafer. After manufacturing the semiconductor wafer, the semiconductor device is manufactured by performing the prescribed processing of the semiconductor wafer.

FIG. 1 is a flowchart illustrating the method for manufacturing the semiconductor device according to the first embodiment.

FIG. 2A to FIG. 2F are schematic cross-sectional views in order of the processes, illustrating the method for manufacturing the semiconductor device according to the first embodiment.

Figure 3:
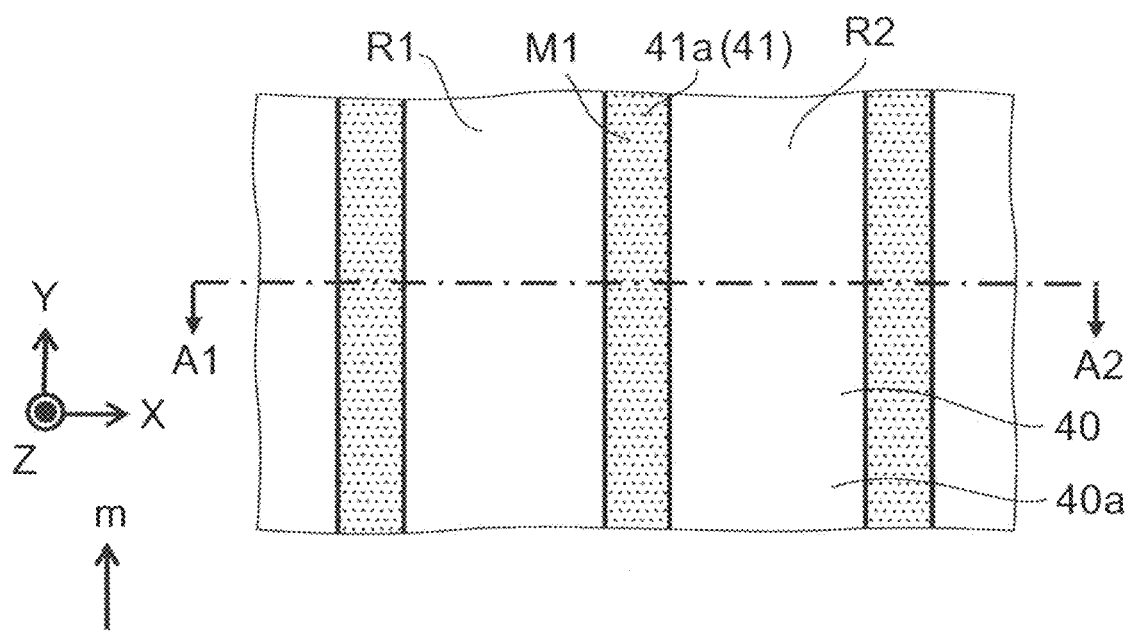
FIG. 3 is a schematic plan view showing the method for manufacturing the semiconductor device according to the first embodiment.

FIG. 3 is a schematic plan view illustrating the method for manufacturing the semiconductor device according to the first embodiment. FIG. 2A to FIG. 2F are cross-sectional views corresponding to the cross section along line A1-A2 of FIG. 3.

As shown in FIG. 1, the method for manufacturing the semiconductor device according to the embodiment includes preparing a substrate unit (step S105), implementing a first growth (step S110), implementing a second growth (step S120), and implementing cooling (step S130).

As shown in FIG. 2A, for example, an intermediate crystal layer 40 is provided on a base substrate 5. In this example, the intermediate crystal layer 40 includes an AlN layer 45 and an AlGaN layer 46. The AlGaN layer 46 is provided on the AlN layer 45. The AlGaN layer 46 may include an $Al_{x1}Ga_{1-x1}N$ (0<x1<1) layer. In this example, the intermediate crystal layer 40 further includes a GaN layer 47. The GaN layer 47 is provided on the AlGaN layer 46.

The intermediate crystal layer 40 has a major surface 40a (the upper surface). The stacking direction from the base substrate 5 toward the intermediate crystal layer 40 is, for example, a Z-axis direction.

The base substrate 5 has a first coefficient of thermal expansion. The intermediate crystal layer 40 has a first lattice constant. The AlN layer 45, the AlGaN layer 46, and the GaN layer 47 are not illustrated for easier viewing in FIG. 2B and subsequent drawings.

As shown in FIG. 2B, a mask layer 41 (a first mask layer 41) is provided in a portion on the major surface 40a of the intermediate crystal layer 40. For example, the major surface 40a has a first region R1, a second region R2, and a first intermediate region M1. The second region R2 is separated from the first region R1 in a first direction perpendicular to the stacking direction. The first direction is, for example, an X-axis direction. The first intermediate region M1 is provided between the first region R1 and the second region R2.

The width of the first region R1 in the first direction is a first width wr1. The width of the second region R2 in the first direction is a second width wr2. The width of the first intermediate region M1 in the first direction is a first intermediate width wm1. For example, the first intermediate width wm1 is narrower than the first width wr1 and narrower than the second width wr2.

As shown in FIG. 3, the first region R1 has, for example, a band configuration extending in the Y-axis direction. The second region R2 has a band configuration extending in the Y-axis direction. The Y-axis direction is perpendicular to the Z-axis direction and the X-axis direction. In the embodiment, the pattern configuration of the first region R1 and the pattern configuration of the second region R2 are arbitrary.

As shown in FIG. 2B and FIG. 3, a first mask layer 41a is provided on the first intermediate region M1. The first mask layer 41a is formed by, for example, disposing a mask having openings on the major surface 40a of the intermediate crystal layer 40 and by, for example, vapor phase formation (e.g., vapor deposition) via the mask. The mask layer 41 (the first mask layer 41a) includes, for example, a metal oxide. For example, the mask layer 41 (the first mask layer 41a) may include silicon oxide.

In step S105 as recited above, a substrate unit 5u including the base substrate 5, the intermediate crystal layer 40, and the first mask layer 41a is prepared.

In step S110 as shown in FIG. 2C, a first lower layer 51l is grown on the first region R1; and a second lower layer 52l is grown on the second region R2. The growth is performed at a first temperature. The first temperature is, for example, not less than 500° C. and not more than 1300° C.

The first lower layer 51l is grown on the intermediate crystal layer 40 of the first region R1. The second lower layer 52l is grown on the intermediate crystal layer 40 of the second region R2.

The first lower layer 51l and the second lower layer 52l have a second coefficient of thermal expansion and a second lattice constant. The second coefficient of thermal expansion is larger than the first coefficient of thermal expansion of the base substrate 5. The second lattice constant is larger than the first lattice constant of the intermediate crystal layer 40.

For example, the base substrate 5 may include, for example, a silicon substrate. On the other hand, the semiconductor crystal may include, for example, a nitride semiconductor. The coefficient of thermal expansion of the nitride semiconductor is larger than the coefficient of thermal expansion of silicon. For example, the base substrate 5 has an orientation in the (111) plane or the (100) plane.

The intermediate crystal layer 40 also includes a nitride semiconductor. The composition of the intermediate crystal layer 40 is different from the composition of the semiconductor crystal of the first lower layer 51l and the second lower layer 52l. In other words, the intermediate crystal layer 40 includes a first nitride semiconductor; and the semiconductor crystal includes a second nitride semiconductor.

For example, the intermediate crystal layer 40 includes an $Al_{x1}Ga_{1-x1}N$ (0<x1≤1) layer (at least one selected from the AlN layer 45 and the AlGaN layer 46) as recited above. The semiconductor crystal includes an $Al_{x2}Ga_{1-x2}N$ (0≤x2<1 and x2<x1) layer. For example, x1 is not less than 0.05 and not more than 0.09. For example, x2 is less than 0.05.

The intermediate crystal layer 40 includes, for example, the AlN layer 45. The semiconductor crystal (the first lower layer 51l and the second lower layer 52l) includes, for example, a GaN layer.

In step S120 as shown in FIG. 2D, a second upper layer 52u is grown on the second lower layer 52l to extend onto the first mask layer 41a while a first upper layer 51u is grown on the first lower layer 51l to extend onto the first mask layer 41a. The growth of the first upper layer 51u and the growth of the second upper layer 52u are performed at a second temperature. The second temperature may be the same as or different from the first temperature. The second temperature is, for example, not less than 500° C. and not more than 1300° C.

The growth of the first upper layer 51u and the growth of the second upper layer 52u include, for example, lateral-direction growth of the first upper layer 51u and the second upper layer 52u. In the lateral-direction growth, the growth rate in a direction (the lateral direction) intersecting the Z-axis direction is higher than the growth rate in the Z-axis direction. For example, it is favorable for the second temperature to be higher than the first temperature. Thereby, the lateral-direction growth is promoted.

As shown in FIG. 2E, the first upper layer 51*u* and the second upper layer 52*u* contact each other on the first mask layer 41*a* by continuing the growth of the first upper layer 51*u* and the second upper layer 52*u*. Then, the first upper layer 51*u* and the second upper layer 52*u* combine. Thereby, the first mask layer 41*a* is covered with the first upper layer 51*u* and the second upper layer 52*u*. The first lower layer 51*l*, the second lower layer 52*l*, the first upper layer 51*u*, and the second upper layer 52*u* are called a growth crystal layer 50*c*. The coefficient of thermal expansion of the growth crystal layer 50*c* is the second coefficient of thermal expansion and is larger than the first coefficient of thermal expansion of the base substrate 5.

Thus, in step S120, the first mask layer 41*a* is covered with the first upper layer 51*u* and the second upper layer 52*u* by causing the first upper layer 51*u* and the second upper layer 52*u* to contact each other on the first mask layer 41*a*.

In step S130, the temperature of the substrate unit 5*u* and the growth crystal layer 50*c* (the first lower layer 51*l*, the second lower layer 52*l*, the first upper layer 51*u*, and the second upper layer 52*u*) is reduced to a third temperature. The third temperature is lower than the first temperature and lower than the second temperature.

As shown in FIG. 2F, the cooling causes the first upper layer 51*u* and the second upper layer 52*u* to separate from each other at a first boundary 55*a* where the first upper layer 51*u* and the second upper layer 52*u* contact each other on the first mask layer 41*a*.

Because the coefficient of thermal expansion (the second coefficient of thermal expansion) of the growth crystal layer 50*c* is larger than the first coefficient of thermal expansion of the base substrate 5, the degree of the contraction of the growth crystal layer 50*c* due to the cooling is larger than the degree of the contraction of the base substrate 5. Therefore, tensile stress is applied to the growth crystal layer 50*c*. The mechanical strength of the growth crystal layer 50*c* at the first boundary 55*a* between the first upper layer 51*u* and the second upper layer 52*u* on the first mask layer 41*a* is lower than at other portions of the growth crystal layer 50*c*. Therefore, the first upper layer 51*u* and the second upper layer 52*u* separate from each other along the first boundary 55*a* due to the tensile stress occurring due to the cooling. The separation includes separating the first upper layer 51*u* and the second upper layer 52*u* by cleavage.

In the embodiment, the growth crystal layer 50*c* is divided in the process of cooling from the growth temperature (the first temperature, the second temperature, etc.) to the third temperature (e.g., room temperature) which is a low temperature.

In a general method, the growth crystal layer 50*c* is divided by dicing, etc., after the crystal growth.

According to the embodiment, the dicing process can be omitted; and a method for manufacturing a semiconductor device having a high manufacturing efficiency can be provided. A high yield is obtained because the dicing process is not performed.

According to the embodiment, multiple micro semiconductor devices can be easily formed on one wafer (the base substrate 5).

There is a method of a reference example in which multiple semiconductor devices are formed by providing a mask unit having openings on one wafer and performing selective growth. In such a method, the crystal growth on the wafer exposed from the openings of the mask unit is performed without crystal growth on the mask unit. The crystal is grown such that the mask unit is not completely covered. In other words, the multiple semiconductor layers are separated from each other at the high temperature at which the growth is performed. In such a method, the element separation process (the dicing, etc.) can be omitted. However, in such a method, the width of the mask unit is wide; and the number of the semiconductor layers (the elements) that can be formed on one wafer is small. The ratio of the total element surface area to the surface area of the wafer is small particularly in the case where the element surface area is small.

Conversely, in the embodiment, the width of the mask layer 41 is small; and the multiple semiconductor layers contact each other at the high temperature at which the growth is performed. Then, the multiple semiconductor layers are separated from each other in the cooling. In the embodiment, the width of the mask layer 41 is narrow. Therefore, the number of the semiconductor layers that can be formed on one wafer is large. In the embodiment, the material usage efficiency in the crystal growth stage is high.

It is desirable to realize a semiconductor device including micro light emitting element portions. In the formation of such a semiconductor device, high controllability of the element separation is desirable. In the embodiment, the cracks that occur due to the difference between the coefficients of thermal expansion of the growth substrate and the growth crystal layer 50*c* are utilized in the process of the crystal growth. By applying the embodiment, the element separation process can be omitted; and unutilized regions of the element surface can be reduced.

The semiconductor device including micro light emitting element portions is applicable to, for example, a display device. For example, the display can be performed by forming multiple light emitting element portions that respectively emit red light, blue light, green light, etc., on one wafer.

One example of the method for manufacturing the semiconductor device according to the embodiment will now be described.

A silicon substrate having the (111) plane is used as the base substrate 5. The silicon substrate is cleaned for 13 minutes with a 1:1 mixed liquid of $H_2O_2$ and $H_2SO_4$. Then, the silicon substrate is cleaned for 10 minutes with 2% HF. After the cleaning, the silicon substrate is introduced to a MOVPE reaction chamber.

The susceptor is heated to 1130° C. in a hydrogen atmosphere; and an AlN layer is formed on the silicon substrate. An $Al_{x1}Ga_{1-x1}N$ (0<x1<1) layer (the AlGaN layer 46) is formed with a thickness of 100 nanometers (nm) on the AlN layer 45. The GaN layer 47 is formed with a thickness of 300 nanometers (nm) on the $Al_{x1}Ga_{1-x1}N$ (0<x1<1) layer. The AlN layer 45, the $Al_{x1}Ga_{1-x1}N$ (0<x1<1) layer (the AlGaN layer 46), and the GaN layer 47 are used to form the intermediate crystal layer 40.

Then, the susceptor is cooled to room temperature; and the wafer (the silicon substrate and the intermediate crystal layer 40) is extracted from the MOVPE reaction chamber. At this point in time, cracks, etc., have not occurred in the intermediate crystal layer 40.

Then, the wafer is introduced to a vapor deposition apparatus. The first mask layer 41*a* is formed using a prescribed mask. The thickness of the first mask layer 41*a* is 100 nm; and the width of the first mask layer 41*a* is 1500 nm. The width of the opening of the first mask layer 41*a* is 4000 nm. The extension direction of the first mask layer 41*a* is substantially parallel to the m plane of the GaN layer of the intermediate crystal layer 40. In other words, the first direction is substantially orthogonal to the m-plane.

Then, the wafer in which the first mask layer 41*a* is formed is cleaned for 13 minutes with a 1:1 mixed liquid of $H_2O_2$ and H$_2$SO$_4$. Continuing, the wafer is cleaned for 3 minutes with 2% HCl. Subsequently, the wafer is introduced to a MOCVD reaction chamber.

The susceptor is heated to 1130° C.; and the first lower layer 51*l*, the second lower layer 52*l*, the first upper layer 51*u*, and the second upper layer 52*u* are formed to form the GaN layer. The GaN layer corresponds to the growth crystal layer 50*c*. The thickness of the GaN layer is, for example, 2000 nm.

The susceptor is cooled to room temperature. The tensile stress caused by the coefficient of thermal expansion difference in the process of cooling acts on the growth crystal layer 50*c*. Cracks occur in the growth crystal layer 50*c* due to the tensile stress. The cracks form on the first mask layer 41. Thereby, the growth crystal layer 50*c* is naturally divided into the desired configuration.

According to the embodiment, the separation process (e.g., the dicing process) of the growth crystal layer 50*c* can be omitted; and a method for manufacturing a semiconductor device having a high manufacturing efficiency can be provided.

In the case where the GaN layer is grown on the silicon substrate without providing the mask layer 41, cracks occur in the GaN layer due to the difference between the coefficients of thermal expansion. It was found that the cracks occur easily along the m plane of the GaN.

On the other hand, in the case where the mask layer 41 is provided in a band configuration on the silicon substrate and the GaN layer is grown, it was found that the cracks occurring in the GaN layer tend to be along the extension direction of the mask layer 41.

According to experiments in which the angle between the extension direction of the mask layer 41 and the direction of the crystal axis of the GaN layer is changed, lateral-direction growth is difficult in the case where the growth direction of the lateral-direction growth of the GaN layer is along the a-axis. For example, the lateral-direction growth of the GaN layer is difficult in the case where the absolute value of the angle between the a-axis and the growth direction of the lateral-direction growth is 7.5 degrees or less. In the case where the growth direction of the lateral-direction growth of the GaN layer is along the m axis, lateral-direction growth is easy. For example, the case where the absolute value of the angle between the m axis and the growth direction of the lateral-direction growth is not more than 22.5 degrees, the lateral-direction growth of the GaN layer is easy.

In the embodiment, the first mask layer 41*a* provided between the first region R1 and the second region R2 is covered with the first upper layer 51*u* and the second upper layer 52*u*. Therefore, the growth direction of the lateral-direction growth is along the first direction.

In the case where the first upper layer 51*u* and the second upper layer 52*u* are nitride semiconductors, it is favorable for the angle between the m axis of the nitride semiconductors and the first direction from the first upper layer 51*u* toward the second upper layer 52*u* to be not more than 22.5 degrees. Thereby, it is easier to cover the first mask layer 41*a* with the first upper layer 51*u* and the second upper layer 52*u*.

In the embodiment, the second lattice constant of the growth crystal layer 50*c* is larger than the first lattice constant of the intermediate crystal layer 40. Therefore, compressive stress is applied to the growth crystal layer 50*c* at the high temperature of the growth. Therefore, cracks do not occur in the growth crystal layer 50*c* in the growth. Then, in the cooling after the growth, a large tensile stress is applied to the growth crystal layer 50*c* due to the difference between the coefficients of thermal expansion of the base substrate 5 and the growth crystal layer 50*c*. Then, due to the tensile stress, the growth crystal layer 50*c* is divided at the first boundary 55*a* between the first upper layer 51*u* and the second upper layer 52*u*.

Tensile stress occurs in the growth in the case where the second lattice constant is smaller than the first lattice constant. Therefore, more tensile stress is applied in the cooling; and cracks occur not only at the first boundary 55*a* but also in regions of the first upper layer 51*u* or the second upper layer 52*u*. Also, there are cases where cracks occur during the growth, and the desired configuration is not obtained.

In the embodiment, by setting the second lattice constant of the growth crystal layer 50*c* to be greater than the first lattice constant of the intermediate crystal layer 40, cracks at the high temperature of the growth are suppressed; and the growth crystal layer 50*c* is divided by the tensile stress occurring in the cooling after the growth. It is favorable for the ratio (A2/A1) of the lattice constant A2 (the unstrained lattice constant) of the material used as the growth crystal layer 50*c* as a single body to the lattice constant A1 of the portion of the intermediate crystal layer 40 contacting the growth crystal layer 50*c* to be, for example, not less than 100.01% and not more than 101.14%. Thereby, the division of the growth crystal layer 50*c* by the tensile stress can be implemented effectively while suppressing the cracks. Considering practical element sizes and materials, it is more favorable for the ratio recited above to be not less than 100.05% and not more than 100.5%.

An example of experimental results of the strain occurring in the growth crystal layer 50*c* (the stress that is applied) and the occurrence of cracks for the embodiment will now be described. In the experiment, the AlN layer 45 is formed on a silicon substrate; an Al$_{0.3}$Ga$_{0.7}$N layer (the AlGaN layer 46) is formed on the AlN layer 45; and the GaN layer 47 is formed on the Al$_{0.3}$Ga$_{0.7}$N layer. These layers are used to form the intermediate crystal layer 40. Then, a GaN layer used to form the growth crystal layer 50*c* is formed on the GaN layer 47. The thickness of the GaN layer is 2000 nm. In the experiment, the stress applied to the GaN layer is changed by changing the conditions of the intermediate crystal layer 40. In the experiment, the cracks are evaluated using an optical microscope.

FIG. 4A to FIG. 4F are optical microscope photographs illustrating characteristics of the nitride semiconductor. FIG. 4A to FIG. 4F are optical microscope photographs of first to sixth samples SP01 to SP06, respectively.

The thickness of the Al$_{0.3}$Ga$_{0.7}$N layer of the intermediate crystal layer 40 of the first sample SP01 is 200 nm. The thickness of the Al$_{0.3}$Ga$_{0.7}$N layer of the intermediate crystal layer 40 of the second sample SP02 is 100 nm. The thickness of the Al$_{0.3}$Ga$_{0.7}$N layer of the intermediate crystal layer 40 of the third sample SP03 is 50 nm. The thickness of the Al$_{0.3}$Ga$_{0.7}$N layer of the intermediate crystal layer 40 of the fourth sample SP04 is 20 nm. The thickness of the Al$_{0.3}$Ga$_{0.7}$N layer of the intermediate crystal layer 40 of the fifth sample SP05 is 5 nm. The thickness of the Al$_{0.3}$Ga$_{0.7}$N layer of the intermediate crystal layer 40 of the sixth sample SP06 is 0 nm. In other words, in the sixth sample SP06, the GaN layer 47 is formed directly on the AlN layer 45. These configurations of the intermediate crystal layer 40 are examples and are not limited thereto if the desired mismatch is obtained as recited below.

Figure 4A:
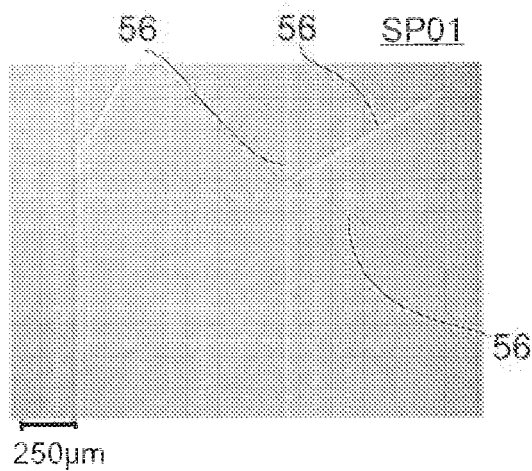
FIG. 4A to FIG. 4F are optical microscope photographs showing characteristics of the nitride semiconductor.
Figure 4B:
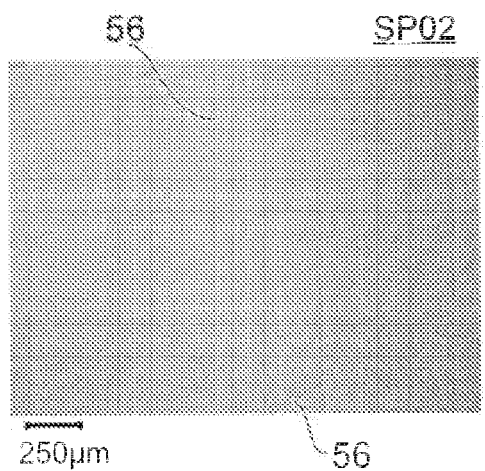
Figure 4C:
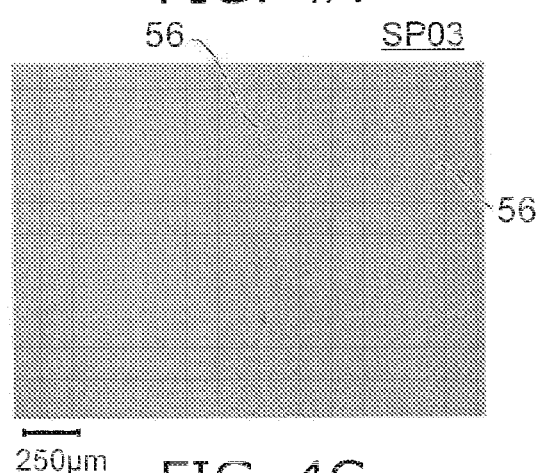
Figure 4D:
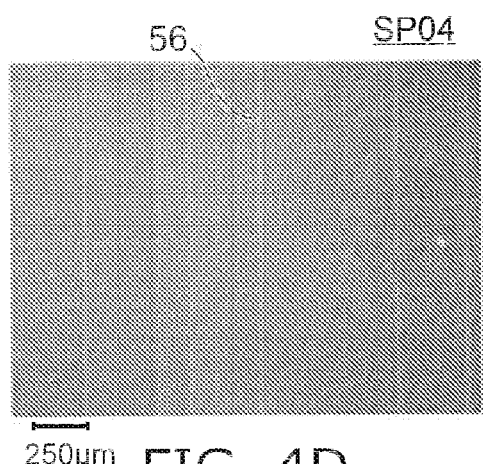
Figure 4E:
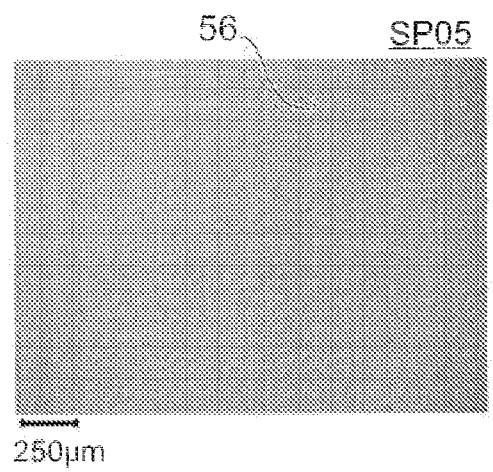
Figure 4F:
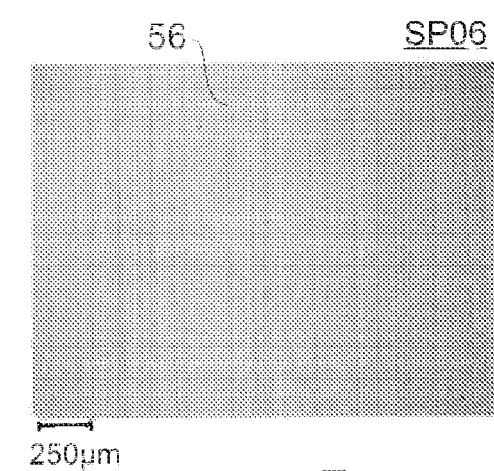

As shown in FIG. 4A, cracks 56 of the first sample SP01 extend in three directions. The spacing between two cracks 56 extending in parallel directions is wide.

As shown in FIG. 4B to FIG. 4F, the spacing of the cracks 56 becomes narrower from the second sample SP02 to the sixth sample SP06.

The spacing of the cracks 56 was measured for these samples. As recited above, the extension directions of the cracks 56 are in three directions. The value of the spacing of the cracks 56 is taken as the spacing between two cracks 56 extending in one direction parallel to each other. The average of the spacing of the cracks 56 is calculated for the cracks 56 of the optical microscope photographs.

On the other hand, the stress applied to the GaN layer of the samples is determined by Raman scattering spectroscopy. The lattice spacing of the sample is determined from the value of the Raman shift obtained by the Raman scattering spectroscopy. The value of the Raman shift of unstrained GaN is 567.819 $cm^{-1}$. This value is the value of the Raman shift of the $E_2^H$ mode of GaN having a wurtzite structure. The change amount from this value corresponds to the difference between the lattice spacing of the unstrained crystal and the lattice spacing of the actual sample. The Raman shift indicates the lattice mismatch and corresponds to the magnitude of the lattice strain. For example, the Raman shift amount corresponds to the lattice mismatch of the a-axis. The lattice mismatch of the a-axis is (Raman shift amount)/(1212.4)×100.

Figure 5:
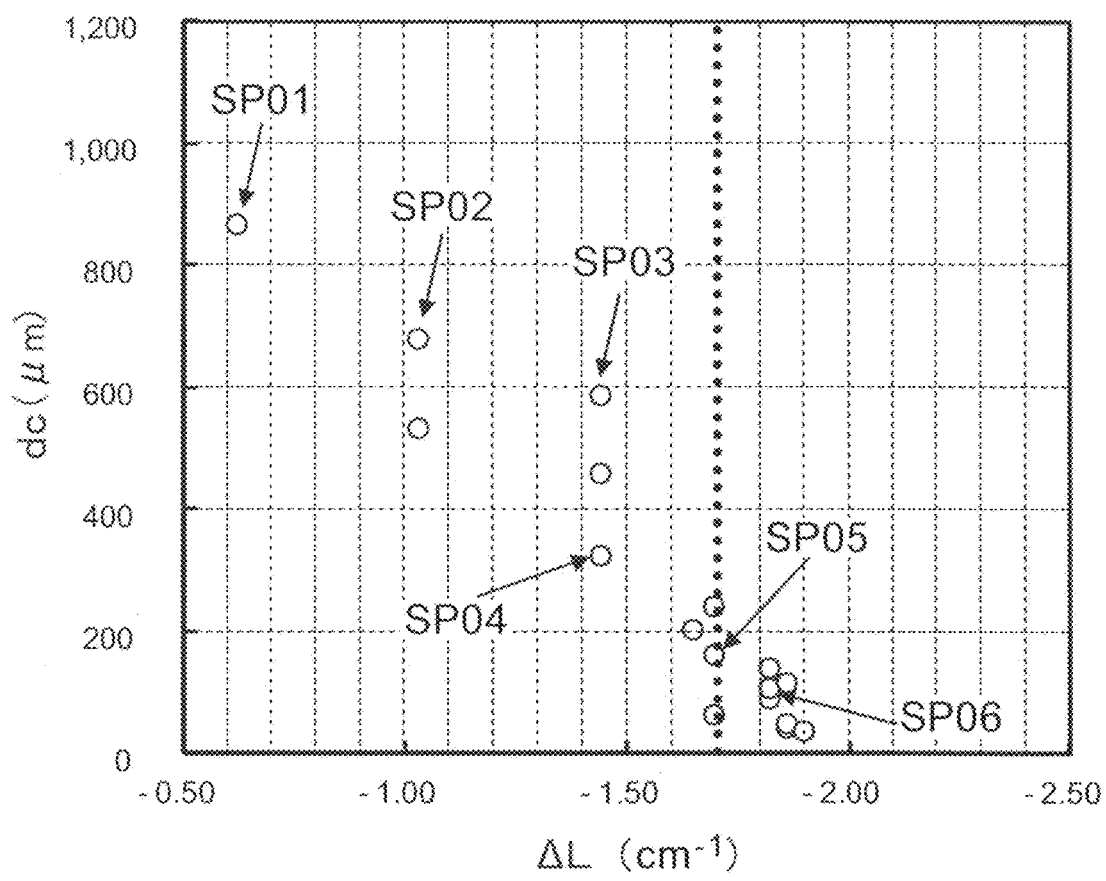
FIG. 5 is a graph showing characteristics relating to the method for manufacturing the semiconductor device.

FIG. 5 is a graph illustrating characteristics relating to the method for manufacturing the semiconductor device.

FIG. 5 shows the measurement results of the relationship between a Raman shift amount $\Delta L$ ($cm^{-1}$) at room temperature and a spacing dc (micrometers (μm)) between the cracks 56. The spacing dc between the cracks 56 is the average for each sample. FIG. 5 shows the values of the first sample SP01 to the sixth sample SP06.

It can be seen from FIG. 5 that the spacing dc of the cracks 56 increases as the absolute value of the Raman shift amount $\Delta L$ decreases. The spacing dc of the cracks 56 is small when the absolute value of the Raman shift amount $\Delta L$ is large.

In the embodiment, the cracks 56 occur on the multiple first mask layers 41a; and the cracks 56 do not occur in the first region R1 or the second region R2. To this end, the spacing dc of the cracks 56 is set to correspond to the width of the first region R1 and the width of the second region R2. In other words, the Raman shift amount $\Delta L$ is set to correspond to the width of the first region R1 and the width of the second region R2. In other words, the lattice mismatch of the growth crystal layer 50c is controlled to correspond to the width of the first region R1 and the width of the second region R2.

For example, in the case where the semiconductor device is formed with an element width of 200 μm, the width of the first region R1 and the width of the second region R2 are 200 μm. In such a case, from FIG. 5, it is favorable for the absolute value of the Raman shift amount $\Delta L$ to be, for example, not less than 1.6 $cm^{-1}$ and not more than 1.8 $cm^{-1}$.

For example, it is favorable for the absolute value of the Raman shift amount $\Delta L$ to be, for example, not less than 1.6 $cm^{-1}$ and not more than 1.8 $cm^{-1}$ when the width of the first region R1 and the width of the second region R2 are not less than 180 μm and not more than 220 μm.

From FIG. 5, the relationship between the Raman shift amount $\Delta L$ ($cm^{-1}$) and the spacing dc (mm) between the cracks 56 is expressed by the following formula.

$$\Delta L = 1.58 \cdot dc - 2$$

Therefore, in the embodiment, it is favorable for the Raman shift amount $\Delta L$ ($cm^{-1}$) to be substantially equal to $1.58 \cdot wr1 - 2$, where the width of the first region R1 in the first direction is the first width wr1 (millimeters (mm)). For example, it is favorable for $\Delta L/(1.58 \cdot wr1 - 2)$ to be not less than 0.8 and not more than 1.2.

Figure 6:
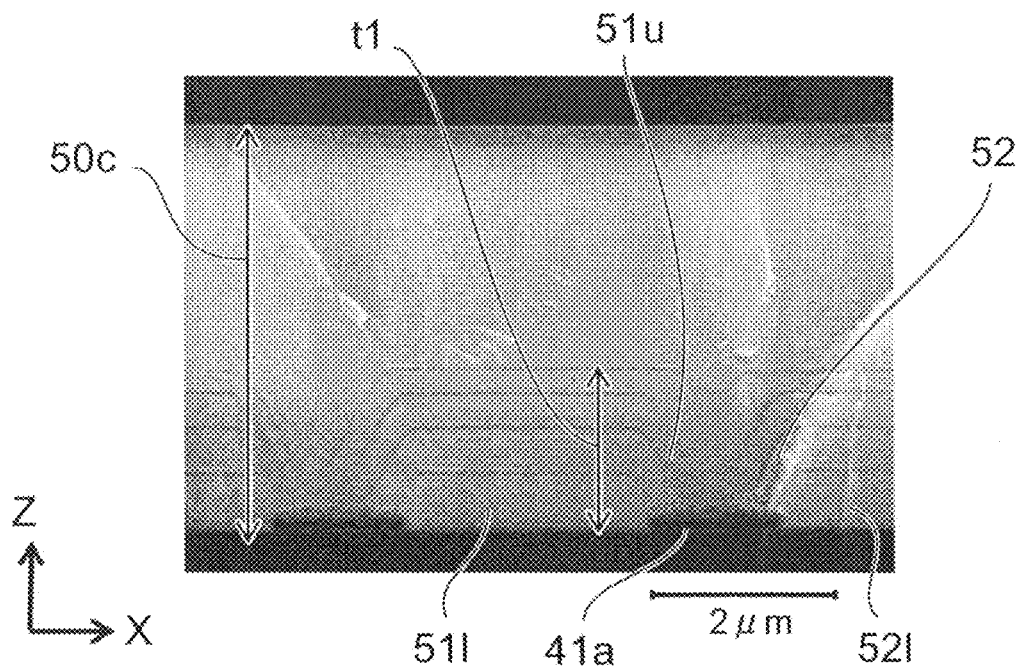
FIG. 6 is an electron microscope photograph showing the method for manufacturing the semiconductor device according to the first embodiment.

FIG. 6 is an electron microscope photograph illustrating the method for manufacturing the semiconductor device according to the first embodiment.

FIG. 6 is a SEM (Scanning Electron Microscope) cross-sectional image of the sample in the case where the width of the first mask layer 41a is 1.5 μm and the spacing between the multiple first mask layers 41a is 1.9 μm. The width of the first mask layer 41a is the width in the first direction and corresponds to the first intermediate width wm1. The spacing between the multiple first mask layers 41a corresponds to the first width wr1 of the first region R1 and the second width wr2 of the second region. The thickness of the GaN layer which is the growth crystal layer 50c is 4.3 μm.

It can be seen from FIG. 6 that the first mask layer 41a is covered with the GaN layer when a thickness t1 of the GaN layer is about 1.7 μm. The upper surface of the growth crystal layer 50c is planarized.

Figure 7:
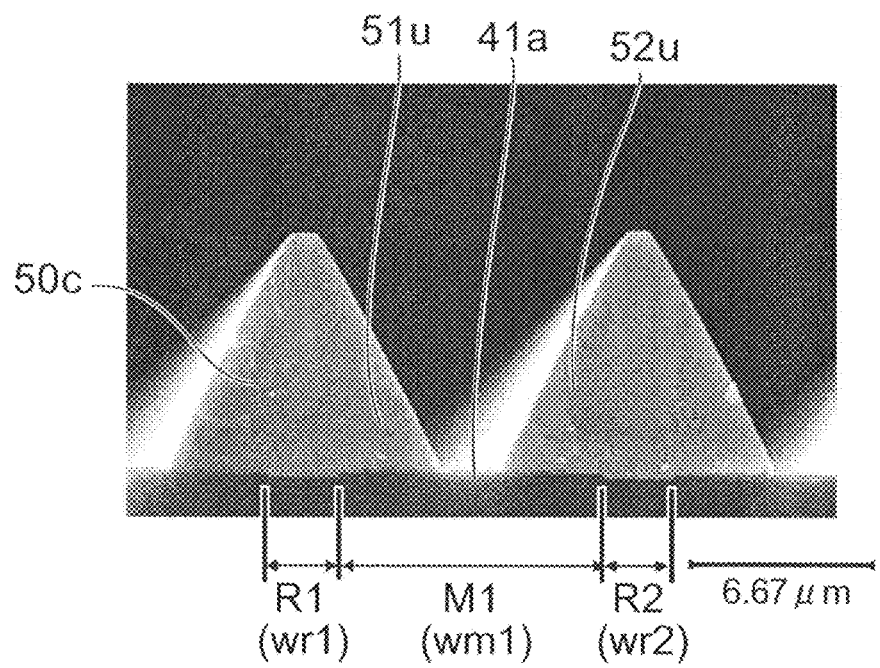
FIG. 7 is an electron microscope photograph showing the method for manufacturing the semiconductor device.

FIG. 7 is an electron microscope photograph illustrating the method for manufacturing the semiconductor device.

FIG. 7 is a SEM cross-sectional image of the sample when the width (the first intermediate width wm1) of the first mask layer 41a is 9.5 μm and the spacing (the first width wr1 and the second width wr2) between the multiple first mask layers 41a is 2.5 μm. The thickness of the GaN layer which is the growth crystal layer 50c is 9.1 μm. The growth time of the GaN layer of the sample of FIG. 7 is the same as the growth time of the GaN layer shown in FIG. 6.

It can be seen from FIG. 7 that the first mask layer 41a is not covered with the growth crystal layer 50c in this sample. The growth crystal layer 50c has a pyramid configuration; and the upper surface of the growth crystal layer 50c is not planarized. In the case where the width (the first intermediate width wm1) of the first mask layer 41a is excessively large, it becomes difficult to cover the first mask layer 41a with the growth crystal layer 50c.

Considering a practical element, the thickness of the growth crystal layer 50c is, for example, not less than 2 μm and not more than 5 μm. Therefore, it is favorable for the width (the first intermediate width wm1) of the first mask layer 41a to be not more than about 9 μm. It is desirable for the width (the first intermediate width wm1) of the first mask layer 41a to be not more than 5 μm. It is desirable for the width (the first intermediate width wm1) of the first mask layer 41a to be not more than 2 μm.

The first width wr1 of the first region R1 in the first direction and the second width wr2 of the second region R2 in the first direction depend on the size of the semiconductor device to be manufactured. From a practical point of view, it is favorable for the first width wr1 and the second width wr2 to be not less than 100 μm and not more than 3000 μm.

Figure 8:
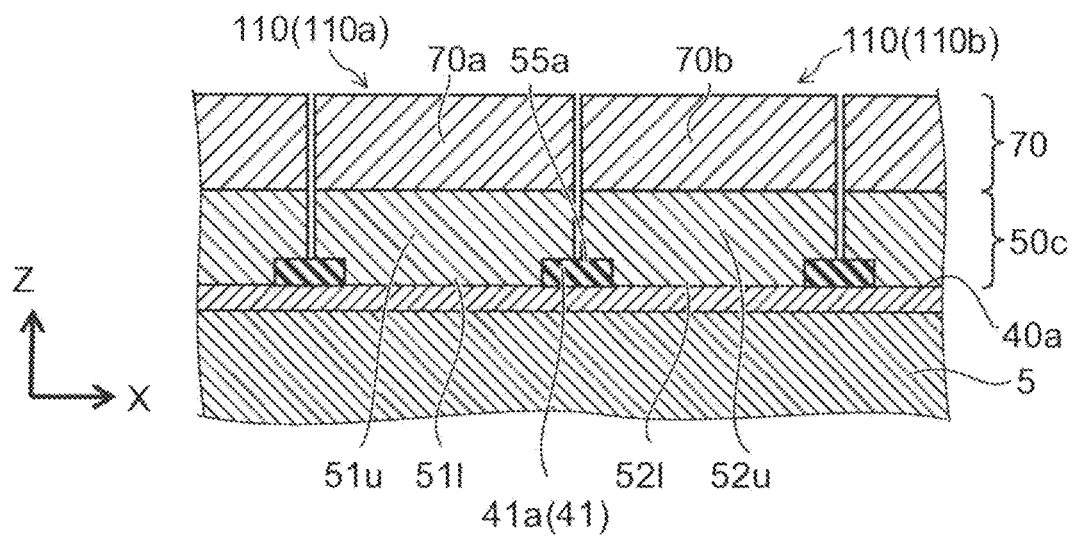
FIG. 8 is a schematic cross-sectional view showing the method for manufacturing the semiconductor device according to the first embodiment.

FIG. 8 is a schematic cross-sectional view illustrating the method for manufacturing the semiconductor device according to the first embodiment. As shown in FIG. 8, a functional layer 70 also may be formed on the growth crystal layer 50c (on the first upper layer 51u and the second upper layer 52u). The functional layer 70 also is subdivided when separating the first upper layer 51u and the second upper layer 52u.

Thus, in this manufacturing method, the second growth (step S120) may further include growing the functional layer 70 (the nitride semiconductor crystal layer) on the first upper layer 51u and the second upper layer 52u.

In such a case, the separation (step S130 which is the cooling) includes separating a first portion 70a of the functional layer 70 (the nitride semiconductor crystal layer) formed on the first upper layer 51u and a second portion 70b of the functional layer 70 (the nitride semiconductor crystal layer) formed on the second upper layer 52u from each other along the first boundary 55a.

Figure 9:
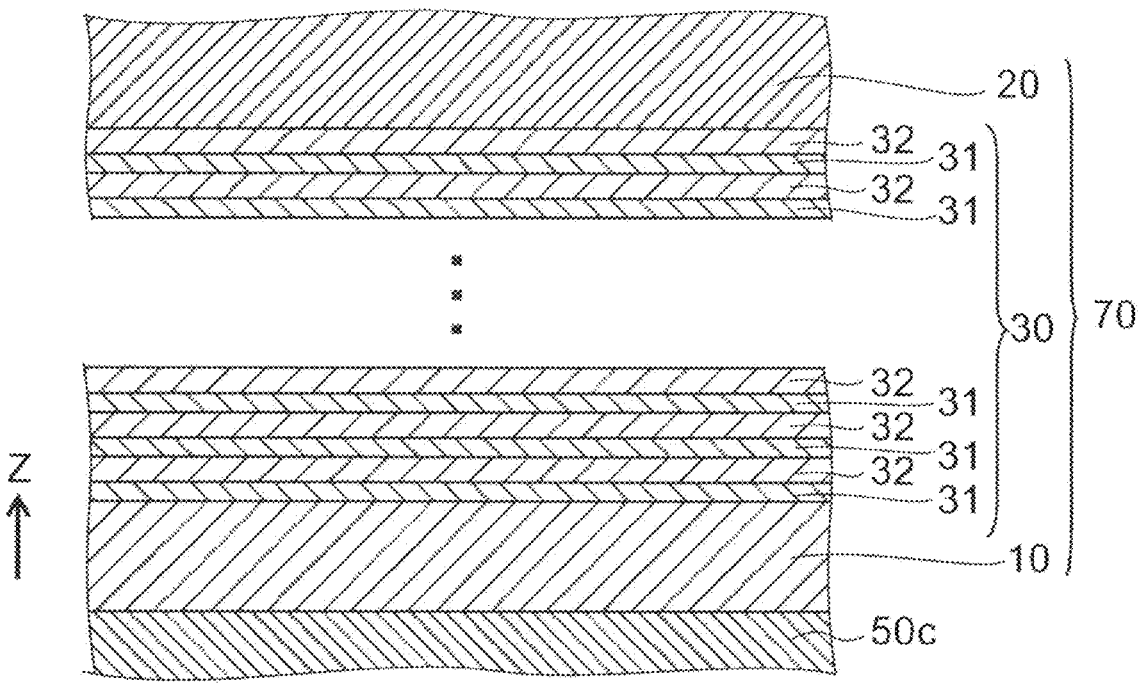
FIG. 9 is a schematic cross-sectional view showing the semiconductor device according to the first embodiment.

FIG. 9 is a schematic cross-sectional view illustrating the semiconductor device according to the first embodiment.

As shown in FIG. 9, the functional layer 70 (the nitride semiconductor crystal layer) may include, for example, a first semiconductor layer 10 of a first conductivity type, a light emitting layer 30 provided on the first semiconductor layer 10, and a second semiconductor layer 20 of a second conductivity type provided on the light emitting layer 30. The semiconductor device is a semiconductor light emitting element.

The light emitting layer 30 includes multiple barrier layers 31, and a well layer 32 provided between the multiple barrier layers 31. The number of the well layers 32 may be one or multiple. In other words, the light emitting layer 30 may have a SQW (Single-Quantum Well) structure or a MQW (Multi-Quantum Well) structure.

The bandgap energy of the barrier layer 31 is greater than the bandgap energy of the well layer 32. The well layer 32 may include, for example, InGaN. The barrier layer 31 includes GaN. In the case where the barrier layer 31 includes InGaN, the In composition ratio of the barrier layer 31 is smaller than the In composition ratio of the well layer 32. The peak wavelength of the light emitted from the light emitting layer 30 is, for example, not less than 200 nm and not more than 1300 nm.

In the embodiment, the growth crystal layer 50c may include at least a portion of the first semiconductor layer 10, the light emitting layer 30, and the second semiconductor layer 20.

Figure 10:
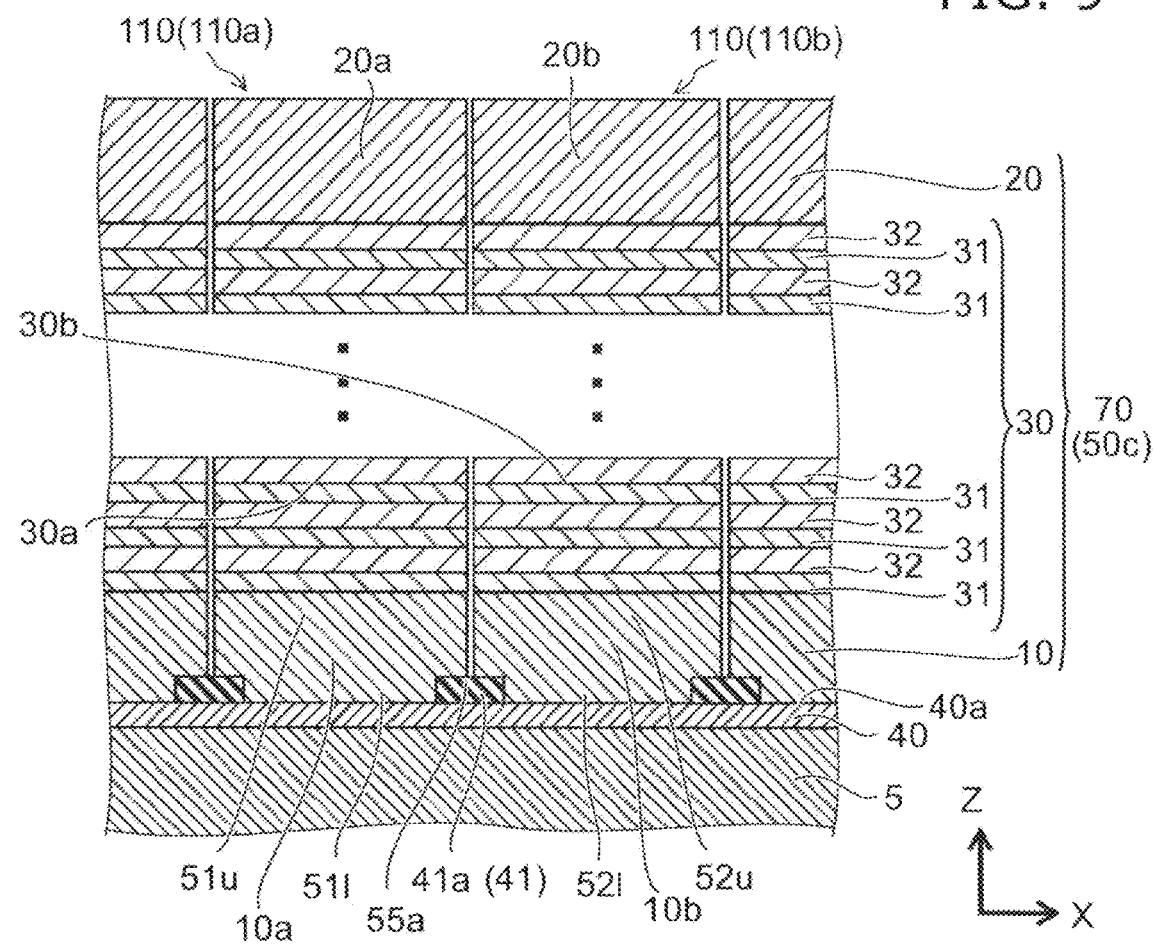
FIG. 10 is a schematic cross-sectional view showing the semiconductor device according to the first embodiment.

FIG. 10 is a schematic cross-sectional view illustrating the semiconductor device according to the first embodiment.

As shown in FIG. 10, the first upper layer 51u includes a first semiconductor layer 10a of the first conductivity type, a first light emitting layer 30a provided on the first semiconductor layer 10a, and a second semiconductor layer 20a of the second conductivity type provided on the first light emitting layer 30a.

The second upper layer 52u includes a third semiconductor layer 10b of the first conductivity type, a second light emitting layer 30b provided on the third semiconductor layer 10b, and a fourth semiconductor layer 20b of the second conductivity type provided on the second light emitting layer 30b.

The first light emitting layer 30a and the second light emitting layer 30b each include the multiple barrier layers 31, and the well layer 32 provided between the multiple barrier layers 31.

The functional layer 70 may have, for example, a FET structure.

Figure 11:
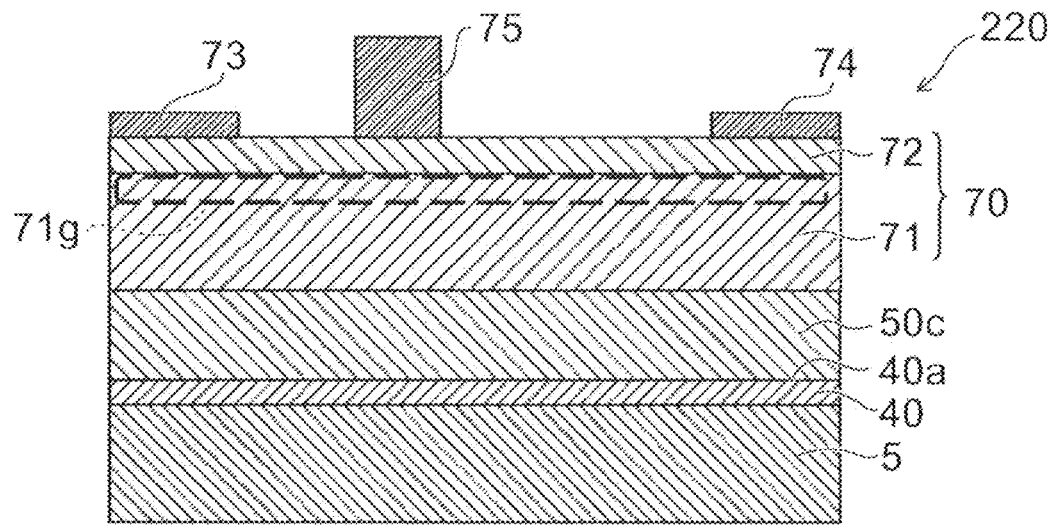
FIG. 11 is a schematic cross-sectional view showing a semiconductor device according to the first embodiment.

FIG. 11 is a schematic cross-sectional view illustrating a semiconductor device according to the first embodiment.

In the semiconductor device according to the embodiment as shown in FIG. 11, an n-type semiconductor layer 71 and an upper semiconductor layer 72 are provided as the functional layer 70. Further, a source electrode 73, a drain electrode 74, and a gate electrode 75 are provided.

The n-type semiconductor layer 71 is provided on the growth crystal layer 50c. The upper semiconductor layer 72 is provided on the n-type semiconductor layer 71. The bandgap energy of the upper semiconductor layer 72 is greater than the bandgap energy of the n-type semiconductor layer 71. The n-type semiconductor layer 71 is used to form a channel layer. The upper semiconductor layer 72 is used to form a barrier layer.

The n-type semiconductor layer 71 includes, for example, undoped $Al_\alpha Ga_{1-\alpha}N$ ($0 \leq \alpha \leq 1$) not including an impurity. The upper semiconductor layer 72 includes, for example, undoped $Al_\beta Ga_{1-\beta}N$ ($0 \leq \beta \leq 1$ and $\alpha < \beta$) or n-type $Al_\beta Ga_{1-\beta}N$ ($0 \leq \beta \leq 1$ and $\alpha < \beta$). For example, the n-type semiconductor layer 71 may include an undoped GaN layer. The upper semiconductor layer 72 may include an undoped AlGaN layer or an n-type AlGaN layer.

The source electrode 73, the drain electrode 74, and the gate electrode 75 are provided on the upper semiconductor layer 72. The drain electrode 74 is separated from the source electrode 73. The source electrode 73 and the drain electrode 74 have ohmic contacts with the surface of the upper semiconductor layer 72. The gate electrode 75 is provided between the source electrode 73 and the drain electrode 74. The gate electrode 75 has a Schottky contact with the surface of the upper semiconductor layer 72.

The lattice constant of the upper semiconductor layer 72 is smaller than the lattice constant of the n-type semiconductor layer 71. Thereby, strain occurs in the upper semiconductor layer 72. Piezoelectric polarization occurs inside the upper semiconductor layer 72 due to the piezoelectric effect. As a result, a two-dimensional electron gas 71g is formed in the n-type semiconductor layer 71 proximal to the interface between the n-type semiconductor layer 71 and the upper semiconductor layer 72.

By controlling the gate voltage applied to the gate electrode 75, the concentration of the two-dimensional electron gas 71g under the gate electrode 75 changes; and the current flowing between the source electrode 73 and the drain electrode 74 is controlled. The semiconductor device is, for example, a HEMT (High Electron Mobility Transistor).

Second Embodiment

In the embodiment, the semiconductor device is disposed two-dimensionally on the wafer.

Figure 12:
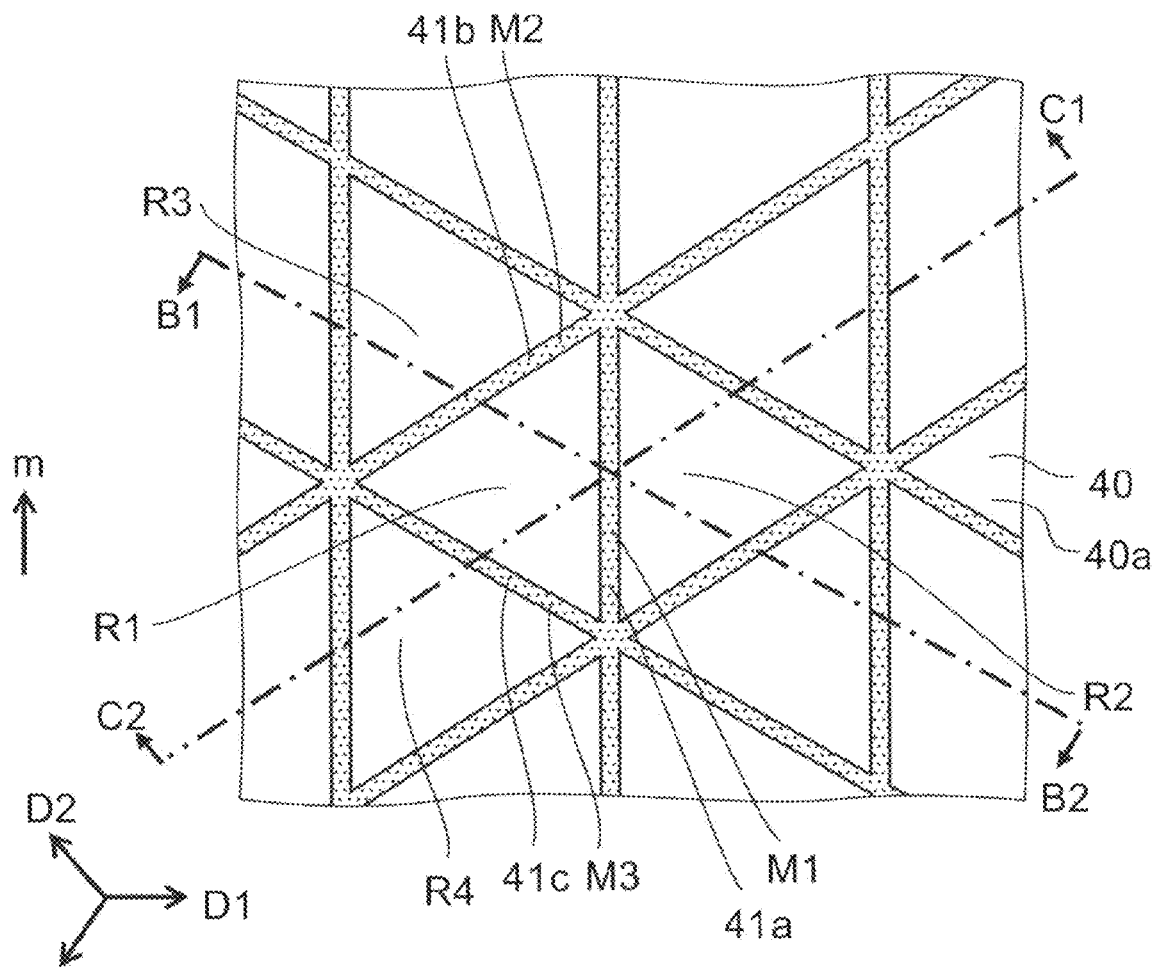
FIG. 12 is a schematic plan view showing a method for manufacturing a semiconductor device according to a second embodiment.

FIG. 12 is a schematic plan view illustrating a method for manufacturing a semiconductor device according to the second embodiment.

Figure 13A:
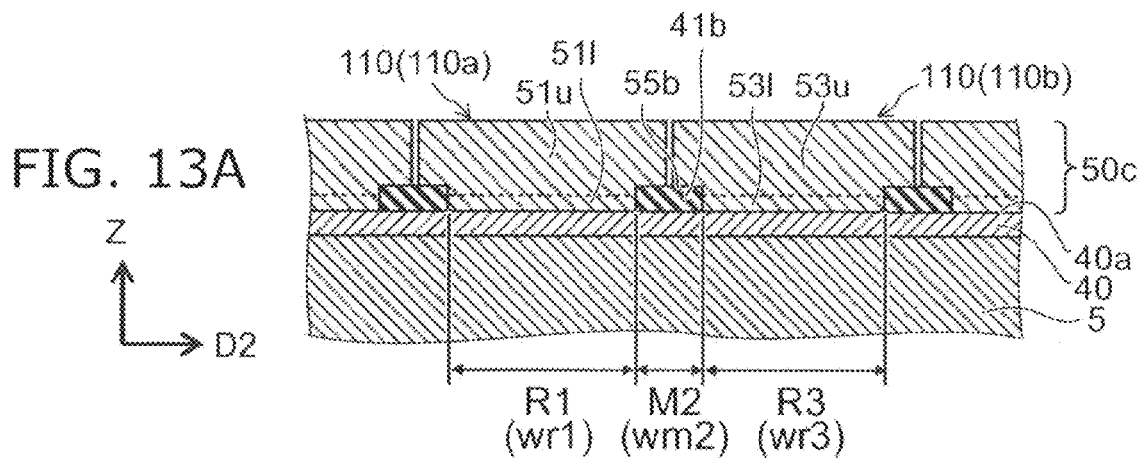
FIG. 13A and FIG. 13B are schematic cross-sectional views showing the method for manufacturing the semiconductor device according to the second embodiment.
Figure 13B:
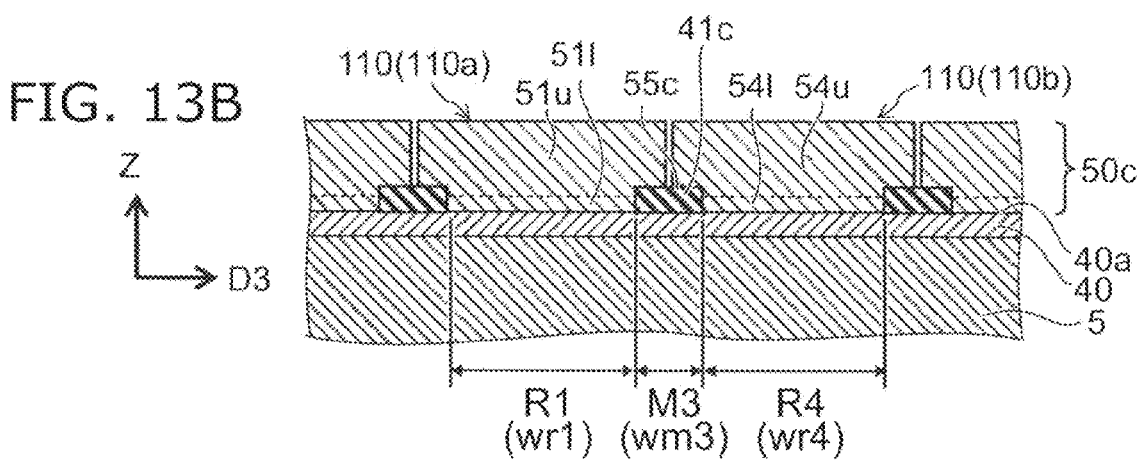

FIG. 13A and FIG. 13B are schematic cross-sectional views illustrating the method for manufacturing the semiconductor device according to the second embodiment.

FIG. 13A corresponds to the cross section along line B1-B2 of FIG. 12. FIG. 13B corresponds to the cross section along line C1-C2 of FIG. 12.

As shown in FIG. 12, FIG. 13A, and FIG. 13B, the major surface 40a of the intermediate crystal layer 40 has not only the first region R1, the second region R2, and the first intermediate region M1 recited above but also a third region R3, a second intermediate region M2, a fourth region R4, and a third intermediate region M3.

The third region R3 is separated from the first region R1 in a second direction D2 that is non-parallel to a first direction D1. The second intermediate region M2 is provided between the first region R1 and the third region R3.

The fourth region R4 is separated from the third region R3. The fourth region R4 is separated from the first region R1 in a third direction D3 that is non-parallel to the first direction D1 and non-parallel to the second direction D2. The third intermediate region M3 is provided between the first region R1 and the fourth region R4.

The pattern configurations of the first region R1, the second region R2, the third region R3, and the fourth regions R4 are triangles.

The substrate unit 5u further includes a second mask layer 41b provided on the second intermediate region M2. The substrate unit 5u further includes a third mask layer 41c provided on the third intermediate region M3.

As shown in FIG. 13A, the implementation of the first growth includes growing a third lower layer 53*l* including the semiconductor crystal recited above on the third region R3 at the first temperature.

The growth of the first upper layer 51*u* includes growing the first upper layer 51*u* to further extend onto the second mask layer 41*b*.

The implementation of the second growth includes growing, at the second temperature, a third upper layer 53*u* including the semiconductor crystal on the third lower layer 53*l* to extend onto the second mask layer 41*b*. The implementation of the second growth further includes covering the second mask layer 41*b* with the first upper layer 51*u* and the third upper layer 53*u* by causing the first upper layer 51*u* and the third upper layer 53*u* to contact each other on the second mask layer 41*b*.

The implementation of the cooling further includes separating the first upper layer 51*u* and the third upper layer 53*u* from each other at the second boundary 55*b* where the first upper layer 51*u* and the third upper layer 53*u* contact each other on the second mask layer 41*b* by reducing the temperature of the third lower layer 53*l* and the third upper layer 53*u* to the third temperature.

The implementation of the first growth includes growing a fourth lower layer 54*l* including the semiconductor crystal on the fourth region R4 at the first temperature.

The growth of the first upper layer 51*u* includes growing the first upper layer 51*u* to further extend onto the third mask layer 41*c*.

The implementation of the second growth includes growing, at the second temperature, a fourth upper layer 54*u* including the semiconductor crystal on the fourth lower layer 54*l* to extend onto the third mask layer 41*c*. The implementation of the second growth further includes covering the third mask layer 41*c* with the first upper layer 51*u* and the fourth upper layer 54*u* by causing the first upper layer 51*u* and the fourth upper layer 54*u* to contact each other on the third mask layer 41*c*.

The implementation of the cooling further includes separating the first upper layer 51*u* and the fourth upper layer 54*u* from each other at a third boundary 55*c* where the first upper layer 51*u* and the fourth upper layer 54*u* contact each other on the third mask layer 41*c* by reducing the temperature of the fourth lower layer 54*l* and the fourth upper layer 54*u* to the third temperature.

In the embodiment as well, a method for manufacturing a semiconductor device having a high manufacturing efficiency in which processes are omitted can be provided.

In the embodiment, the angle between the first direction D1 and the second direction D2 is about 120 degrees (not less than 115 degrees and not more than 125 degrees). The angle between the first direction D1 and the third direction D3 is about 120 degrees (not less than 115 degrees and not more than 125 degrees).

The direction from the third region R3 toward the fourth region R3 is substantially perpendicular to the first direction D1. The absolute value of the angle between the first direction D1 and the direction from the third region R4 toward the fourth region R4 is not less than 85 degrees and not more than 95 degrees.

Figure 14:
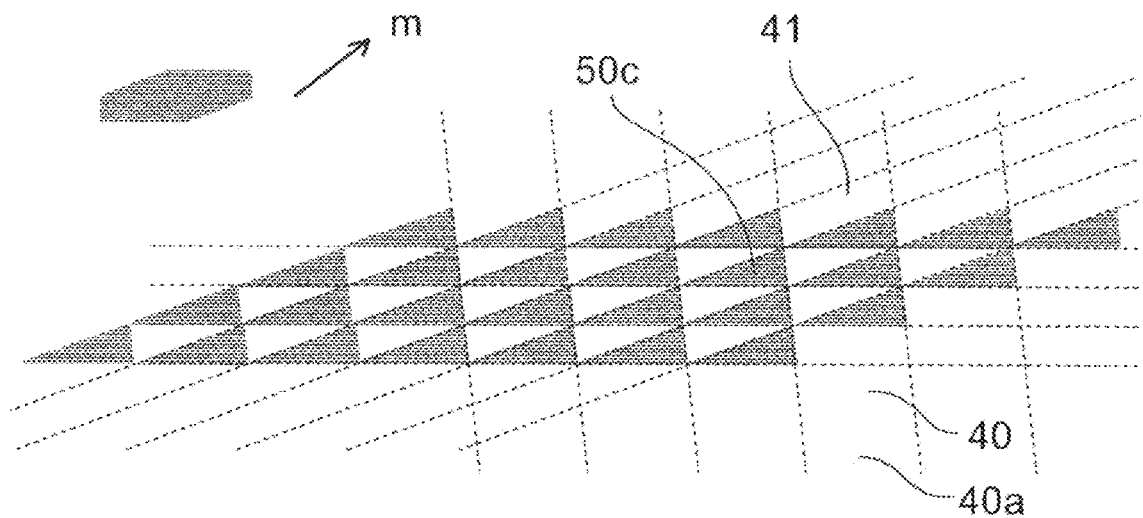
FIG. 14 is a schematic perspective view showing the method for manufacturing the semiconductor device according to the second embodiment.

FIG. 14 is a schematic perspective view illustrating the method for manufacturing the semiconductor device according to the second embodiment.

As shown in FIG. 14, mask layers 41 having three types of band configurations extending in three directions are provided on the major surface 40*a* of the intermediate crystal layer 40. The extension direction of at least one selected from the mask layers 41 is substantially along the m-axis direction of the growth crystal layer 50*c*. The absolute value of the angle between the m-axis direction and the extension direction of the at least one selected from the mask layers 41 is not more than 22.5 degrees.

Figure 15:
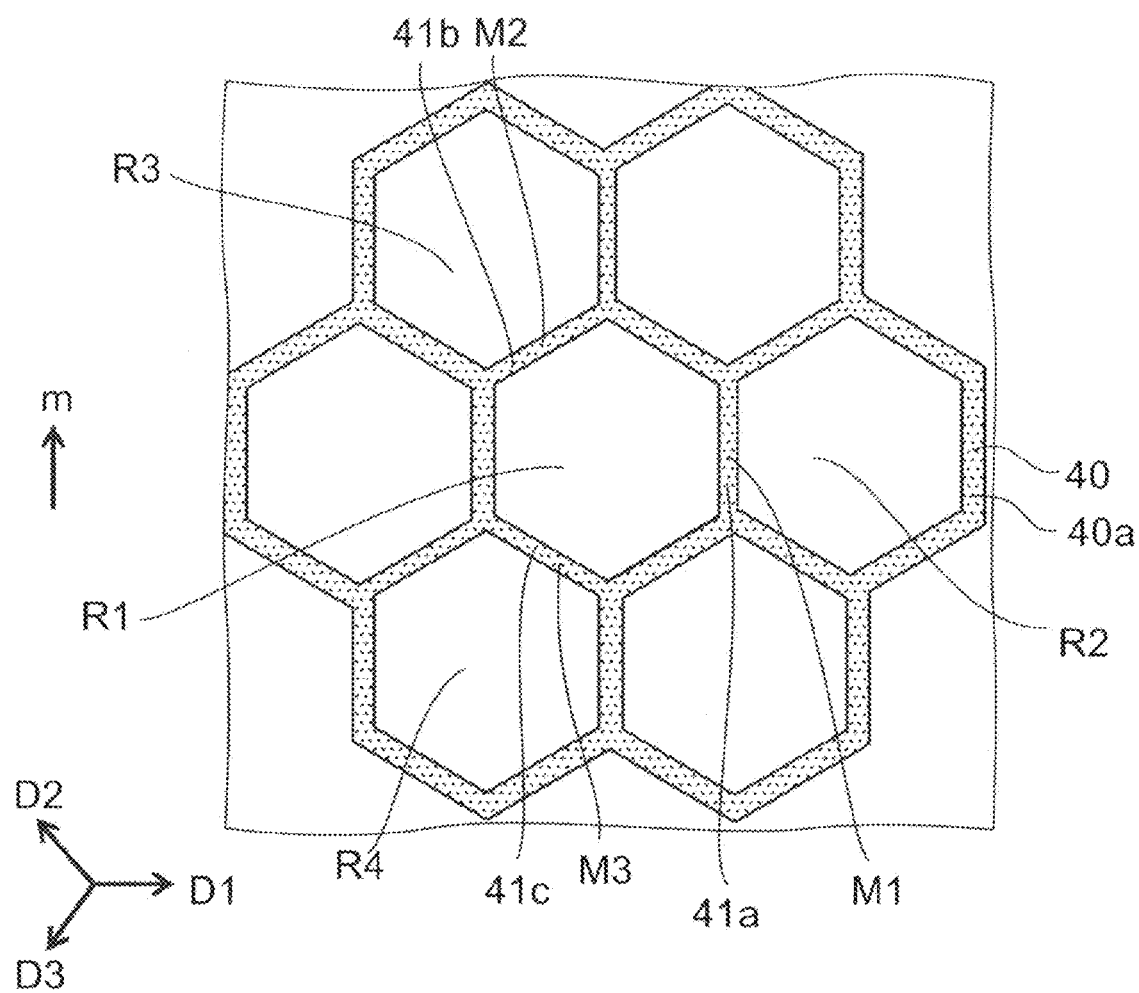
FIG. 15 is a schematic plan view showing the method for manufacturing the semiconductor device according to the second embodiment.

FIG. 15 is a schematic plan view illustrating the method for manufacturing the semiconductor device according to the second embodiment.

As shown in FIG. 15, in such a case as well, the major surface 40*a* of the intermediate crystal layer 40 has the first region R1, the second region R2, the first intermediate region M1, the third region R3, the second intermediate region M2, the fourth region R4, and the third intermediate region M3 recited above.

The pattern configurations of the first region R1, the second region R2, the third region R3, and the fourth regions R4 are hexagons.

In such a case as well, the angle between the first direction D1 and the second direction D2 is not less than 115 degrees and not more than 125 degrees. The angle between the first direction D1 and the third direction D3 is not less than 115 degrees and not more than 125 degrees. The absolute value of the angle between the first direction D1 and the direction from the third region R3 toward the fourth region R4 is not less than 85 degrees and not more than 95 degrees.

For the third region R3 of a different position, the angle between the first direction D1 and the second direction D2 is about 60 degrees (not less than 55 degrees and not more than 65 degrees).

In the embodiment, the mask layers 41 (the first mask layer 41*a*, the second mask layer 41*b*, and the third mask layer 41*c*) have, for example, band configurations.

Multiple mask layers 41 may be provided; and the extension directions of the multiple mask layers 41 may intersect each other. The mask layers 41 are provided, for example, in a lattice configuration.

The pattern configurations of the regions (e.g., the first region R1, etc.) that are formed between the multiple mask layers 41 are arbitrary. The pattern configurations are, for example, quadrilaterals, triangles, hexagons, etc.

The materials of the multiple mask layers 41 may be the same or may be different from each other.

The mask layer 41 is formed, for example, at the major surface 40*a* of the intermediate crystal layer 40. At least a portion of the mask layer 41 may be buried in the intermediate crystal layer 40.

It is favorable for the mask layer 41 to extend in a direction perpendicular to the direction of the growth crystal layer 50*c* in which the lateral-direction growth is good. For example, the growth crystal layer 50*c* (the nitride semiconductor layer) grows on the (0001) plane side. In such a case, it is favorable for the extension direction of the mask layer 41 to be along the m plane of the nitride semiconductor layer. For example, the absolute value of the angle between the extension direction of the mask layer 41 and the m plane of the nitride semiconductor layer is within 22.5°. In this range, the lateral-direction growth of the nitride semiconductor layer is better; and it is easier to cover the mask layer 41.

The thickness of the growth crystal layer 50*c* is thicker than the thickness of the mask layer 41. For example, the thickness of the first upper layer 51*u* and the thickness of the second upper layer 52*u* are thicker than the thickness of the first mask layer 41*a*.

The device structure (e.g., the functional layer 70) included in the semiconductor device is formed on the growth crystal layer 50*c*. For example, the functional layer 70 is formed on the growth crystal layer 50*c* after the surface is planarized by the growth crystal layer 50c. Or, the device structure may be included in the growth crystal layer 50c.

The growth crystal layer 50c (and the functional layer 70) that are formed by the manufacturing method according to the embodiments may be, for example, peeled from the base substrate 5. The electrodes can be formed appropriately; and the semiconductor device can be formed.

According to the embodiments, a semiconductor device having good crystallinity and having little destruction or degradation of the nitride semiconductor layer can be provided.

According to the embodiments, a nitride semiconductor layer and a device structure having substantially the same surface area as the growth substrate can be obtained as independent elements with high material yield without using an element separation process.

In the embodiments, other than silicon, the base substrate 5 may include, for example, $SiO_2$ (silicon dioxide), an aluminum oxide of sapphire and the like, a compound including silicon dioxide and aluminum oxide, a metal oxide such as ZnO, $ZrO_2$, and the like, a nitride such as GaN and the like, a carbide such as SiC, graphene, and the like, a metal such as $ZrB_2$, Mo, and the like, or a metal multilayered stacked body such as Mo/Cu and the like.

In the embodiments, for example, metal-organic chemical vapor deposition (MOCVD), metal-organic vapor phase epitaxy (MOVPE), molecular beam epitaxy (MBE), hydride vapor phase epitaxy (HVPE), etc., may be used to grow the semiconductor layers.

For example, in the case where MOCVD or MOVPE is used, the following source materials may be used when forming the semiconductor layers. For example, TMGa (trimethylgallium) and TEGa (triethylgallium) may be used as the source material of Ga. For example, TMIn (trimethylindium), TEIn (triethylindium), etc., may be used as the source material of In. For example, TMAl (trimethylaluminum), etc., may be used as the source material of Al. For example, $NH_3$ (ammonia), MMHy (monomethylhydrazine), DMHy (dimethylhydrazine), etc., may be used as the source material of N.

For example, the following may be used as the source materials of the impurities. For example, silane ($SiH_4$) may be used as the source-material gas of Si. For example, bis(cyclopentadienyl)magnesium ($Cp_2Mg$) may be used as the source material of Mg. For example, tricarbonylmanganese (MMT) may be used as the source material of Mn. For example, iron carbonyl ($Fe(CO)_5$) or ferrocene ($Cp_2Fe$) may be used as the source material of Fe. For example, oxygen plasma may be used as the source material of oxygen (O).

According to the embodiments, a method for manufacturing a semiconductor device having a high manufacturing efficiency in which processes are omitted is provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as base substrates, intermediate crystal layers, mask layers, growth crystal layers, functional layers, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all methods for manufacturing semiconductor devices practicable by an appropriate design modification by one skilled in the art based on the methods for manufacturing the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, comprising:

preparing a substrate unit comprising a base substrate, an intermediate crystal layer provided on the base substrate, and a first mask layer, the base substrate having a first coefficient of thermal expansion, the intermediate crystal layer having a first lattice constant, the intermediate crystal layer having a major surface having a first region, a second region, and a first intermediate region provided between the first region and the second region, the second region being separated from the first region in a first direction perpendicular to a stacking direction from the base substrate toward the intermediate crystal layer, the first mask layer being provided on the first intermediate region, and wherein the first mask layer is not provided on the first region and is not provided on the second region;

implementing a first growth to grow a first lower layer on the first region at a first temperature and grow a second lower layer on the second region at the first temperature, the first lower layer comprising a semiconductor crystal having a second coefficient of thermal expansion larger than the first coefficient of thermal expansion and a second lattice constant larger than the first lattice constant, the second lower layer comprising the semiconductor crystal;

implementing, at a second temperature, a second growth to grow a second upper layer comprising the semiconductor crystal on the second lower layer to extend onto the first mask layer while growing a first upper layer comprising the semiconductor crystal on the first lower layer to extend onto the first mask layer to cover the first mask layer with the first upper layer and the second upper layer by causing the first upper layer and the second upper layer to contact each other on the first mask layer; and implementing cooling to separate the first upper layer and the second upper layer from each other at a first boundary where the first upper layer and the second upper layer contact each other on the first mask layer by reducing a temperature of the substrate unit, the first lower layer, the second lower layer, the first upper layer, and the second upper layer to a third temperature lower than the first temperature and the second temperature, wherein:

the intermediate crystal layer comprises an $Al_{x1}Ga_{1-x1}N$ layer, wherein x1 is not less than 0.05 and not more than 0.95, the semiconductor crystal comprises an $Al_{x2}Ga_{1-x2}N$ layer, wherein x2 is not less than 0 and not more than 0.05, and $\Delta L/(1.58 wr1 - 2)$ is not less than 0.8 and not more than 1.2, where the Raman shift amount of the first upper layer and the second upper layer is $\Delta L$ ($cm^{-1}$), and a width of the first region in the first direction is wr1 (millimeters).

2. The method according to claim 1, wherein the separating comprises separating the first upper layer and the second upper layer by cleavage.

3. The method according to claim 1, wherein the intermediate crystal layer comprises a first nitride semiconductor, and the semiconductor crystal comprises a second nitride semiconductor.

4. The method according to claim 1, wherein the intermediate crystal layer further comprises an AlN layer, and the $Al_{x1}Ga_{1-x1}N$ layer (0<x1<1) is provided on the AlN layer.

5. The method according to claim 1, wherein the base substrate is a silicon substrate.

6. The method according to claim 1, wherein the first mask layer comprises a metal oxide.

7. The method according to claim 1, wherein the first mask layer comprises silicon oxide.

8. The method according to claim 1, wherein a width of the first intermediate region in the first direction is not more than 9 micrometers.

9. The method according to claim 1, wherein a width of the first region in the first direction and a width of the second region in the first direction are not less than 100 micrometers and not more than 3,000 micrometers.

10. The method according to claim 1, wherein the second growth further comprises growing a nitride semiconductor crystal layer on the first upper layer and the second upper layer; and the separating comprises separating, along the first boundary, a first portion of the nitride semiconductor crystal layer formed on the first upper layer from a second portion of the nitride semiconductor crystal layer formed on the second upper layer.

11. The method according to claim 10, wherein the nitride semiconductor crystal layer comprises:

a first semiconductor layer of a first conductivity type;
a light emitting layer provided on the first semiconductor layer; and
a second semiconductor layer of a second conductivity type provided on the light emitting layer.

12. The method according to claim 1, wherein the first upper layer comprises:

a first semiconductor layer of a first conductivity type;
a first light emitting layer provided on the first semiconductor layer; and a second semiconductor layer of a second conductivity type provided on the first light emitting layer, and the second upper layer comprises:

a third semiconductor layer of the first conductivity type;
a second light emitting layer provided on the third semiconductor layer; and
a fourth semiconductor layer of the second conductivity type provided on the second light emitting layer.

13. A method for manufacturing a semiconductor device, comprising:

preparing a substrate unit comprising a base substrate, an intermediate crystal layer provided on the base substrate, and a first mask layer, the base substrate having a first coefficient of thermal expansion, the intermediate crystal layer having a first lattice constant, the intermediate crystal layer having a major surface having a first region, a second region, and a first intermediate region provided between the first region and the second region, the second region being separated from the first region in a first direction perpendicular to a stacking direction from the base substrate toward the intermediate crystal layer, the first mask layer being provided on the first intermediate region, and wherein the first mask layer is not provided on the first region and is not provided on the second region;

implementing a first growth to grow a first lower layer on the first region at a 1st temperature and grow a second lower layer on the second region at the first temperature, the first lower layer comprising a semiconductor crystal having a second coefficient of thermal expansion larger than the first coefficient of thermal expansion and a second lattice constant larger than the first lattice constant, the second lower layer comprising the semiconductor crystal;

implementing, at a second temperature, a second growth to grow a second upper layer comprising the semiconductor crystal on the second lower layer to extend onto the first mask layer while growing a first upper layer comprising the semiconductor crystal on the first lower layer to extend onto the first mask layer to cover the first mask layer with the first upper layer and the second upper layer by causing the first upper layer and the second upper layer to contact each other on the first mask layer; and implementing cooling to separate the first upper layer and the second upper layer from each other at a first boundary where the first upper layer and the second upper layer contact each other on the first mask layer by reducing a temperature of the substrate unit, the first lower layer, the second lower layer, the first upper layer, and the second upper layer to a third temperature lower than the first temperature and the second temperature;

wherein the major surface further comprises:

a third region separated from the first region in a second direction non-parallel to the first direction; and
a second intermediate region provided between the first region and the third region, the substrate unit further comprises a second mask layer provided on the second intermediate region, the implementing of the first growth comprises growing a third lower layer comprising the semiconductor crystal on the third region at the first temperature, the growing of the first upper layer comprises growing the first upper layer to further extend onto the second mask layer, the implementing of the second growth comprises: growing, at the second temperature, a third upper layer comprising the semiconductor crystal on the third lower layer to extend onto the second mask layer; and covering the second mask layer with the first upper layer and the third upper layer by causing the first upper layer and the third upper layer to contact each other on the second mask layer, and the implementing of the cooling further comprises separating the first upper layer and the third upper layer from each other at a second boundary where the first upper layer and the third upper layer contact each other on the second mask layer by reducing the temperature of the third lower layer and the third upper layer to the third temperature.

14. The method according to claim 13, wherein the major surface further comprises:
   a fourth region separated from the first region in a third direction non-parallel to the first direction and non-parallel to the second direction while being separated from the third region; and
   a third intermediate region provided between the first region and the fourth region, the substrate unit further comprises a third mask layer provided on the third intermediate region, the implementing of the first growth comprises growing a fourth lower layer comprising the semiconductor crystal on the fourth region at the first temperature, the growing of the first upper layer comprises growing the first upper layer to further extend onto the third mask layer, the implementing of the second growth comprises: growing, at the second temperature, a fourth upper layer comprising the semiconductor crystal on the fourth lower layer to extend onto the third mask layer; and covering the third mask layer with the first upper layer and the fourth upper layer by causing the first upper layer and the fourth upper layer to contact each other on the third mask layer, the implementing of the cooling further comprises separating the first upper layer and the fourth upper layer from each other at a third boundary where the first upper layer and the fourth upper layer contact each other on the third mask layer by reducing the temperature of the fourth lower layer and the fourth upper layer to the third temperature.

15. The method according to claim 14, wherein an angle between the first direction and the second direction is not less than 115 degrees and not more than 125 degrees,
   an angle between the first direction and the third direction is not less than 115 degrees and not more than 125 degrees, and
   an absolute value of an angle between the first direction and a direction from the third region toward the fourth region is not less than 85 degrees and not more than 95 degrees.

16. The method according to claim 13, wherein an angle between the first direction and the second direction is not less than 55 degrees and not more than 65 degrees or is not less than 115 degrees and not more than 125 degrees.

17. The method according to claim 1, wherein the base substrate has an orientation in a (111) plane or a (100) plane.

18. The method of claim 1 comprising
   manufacturing multiple microsemiconductor devices on a single wafer or other substrate.

19. The method according to claim 18, wherein
   the intermediate crystal layer comprises an $Al_{x1}Ga_{1-x1}N$ layer, wherein $0.05 \leq x1 \leq 0.95$, and
   the semiconductor crystal comprises an $Al_{x2}Ga1_{1-x2}N$ layer, wherein $x2<0.05$.

20. The method according to claim 19, wherein $\Delta L/(1.58 \cdot wr1-2)$ is not less than 0.8 and not more than 1.2, where the Raman shift amount of the first upper layer and the second upper layer is $\Delta L$ ($cm^{-1}$), and a width of the first region in the first direction is wr1 (millimeters).

* * * * *